(12) United States Patent
Yamamoto et al.

(10) Patent No.: US 7,369,328 B2
(45) Date of Patent: May 6, 2008

(54) OPTICAL PATH CHANGE TYPE OPTICAL COUPLING ELEMENT

(75) Inventors: Ryo Yamamoto, Kyoto (JP); Makoto Tsuchida, Kyoto (JP); Masayoshi Tani, Higashiomi (JP); Shogo Nagasaka, Ritto (JP); Hirokazu Tanaka, Nagaokakyo (JP)

(73) Assignee: Omron Corporation, Kyoto (JP)

( * ) Notice: Subject to any disclaimer, the term of this patent is extended or adjusted under 35 U.S.C. 154(b) by 152 days.

(21) Appl. No.: 10/564,144

(22) PCT Filed: Jul. 12, 2004

(86) PCT No.: PCT/JP2004/009943

§ 371 (c)(1), (2), (4) Date: Jan. 10, 2006

(87) PCT Pub. No.: WO2005/006032

PCT Pub. Date: Jan. 20, 2005

(65) Prior Publication Data

US 2006/0164738 A1 Jul. 27, 2006

(30) Foreign Application Priority Data

Jul. 10, 2003 (JP) ............................. 2003-273059

(51) Int. Cl.
*G02B 17/00* (2006.01)
(52) U.S. Cl. ...................... 359/726; 359/598; 359/627; 385/33; 385/39; 385/47
(58) Field of Classification Search ................ 359/598, 359/627, 726; 385/33, 47, 39
See application file for complete search history.

(56) References Cited

U.S. PATENT DOCUMENTS 6,956,995 B1 * 10/2005 Shafaat et al. ................ 385/39

FOREIGN PATENT DOCUMENTS

JP 59-7903 1/1984
JP 2003-14987 1/2003

OTHER PUBLICATIONS

International Search Report for PCT/JP2004/009943 dated Sep. 21, 2004 (1 page).
Patent Abstracts of Japan 9-281302 dated Oct. 31, 1997 (full copy-6 pages); cited in specification.
esp@cenet Abstract for JP59007903 dated Jan. 17, 1984 (1 page) (relates to BA).
esp@cenet Abstract for JP2003014987 dated Jan. 15, 2003 (1 page) (relates to BB).

* cited by examiner

*Primary Examiner*—Hung Dang
*Assistant Examiner*—Joseph Martinez
(74) *Attorney, Agent, or Firm*—Osha Liang LLP

(57) ABSTRACT

A resin molding body has two faces (front face 15 and lower face 19) perpendicular to each other, and also has a total reflecting face 23 approximately having an angle of 45° with respect to these two faces. Plural collimating lenses 16 and a spacer 17 are integrally formed on one face. Plural collimating lenses 20 and a spacer 21 are also integrally formed on the other face. A wall taking-away portion 26 is concavely arranged between the two faces so as to be located on the rear face side of the total reflecting face 23. Guide holes 18, 22 for inserting guide pins thereinto and connected to optical connectors, etc. are bored on the two faces of the resin molding body.

4 Claims, 14 Drawing Sheets

OPTICAL PATH CHANGE TYPE OPTICAL COUPLING ELEMENT

TECHNICAL FIELD

The present invention relates to an optical path converting type optical coupling element used in optical coupling between light transmitting paths.

BACKGROUND ART

FIG. 1 is a schematic sectional view showing the structure of a conventional optical path converting type optical coupling element 1 (e.g., JP-A-9-281302). In this optical path converting type optical coupling element 1, plural micro lenses 3 are arranged on the front face (or lower face) of a glass substrate 2. An inclining face 4 is formed in the upper portion of the rear face of the glass substrate 2, and the lower face 5 of the glass substrate 2 is formed so as to become a horizontal face.

FIG. 1 also shows a using state of this optical path converting type optical coupling element 1. Each of plural optical fibers 6 is opposed to each micro lens 3 arranged on the front face of the optical path converting type optical coupling element 1. A light receiving element 8 mounted onto a substrate 7 is arranged at a converging point of light L emitted from each optical fiber 6 and totally reflected on the inclining face 4. Accordingly, if such an optical path converting type optical coupling element 1 is used, the light L emitted from the optical fiber 6 is converged by the micro lens 3 and is introduced into the glass substrate 2 and is totally reflected on the inclining face 4. Thus, the direction of the light is converted downward, and the light L emitted from the lower face 5 of the optical path converting type optical coupling element 1 is converged on a light receiving face of the light receiving element 8.

In such an optical path converting type optical coupling element 1, the micro lens 3 is arranged on only one of the front face and the lower face of the glass substrate 2. Therefore, no bidirectional coupling can be performed between the optical fiber and the light receiving element or a light emitting element. Namely, when the optical fiber 6 is opposed to the front face of the optical path converting type optical coupling element 1 and the light receiving element 8 is arranged on the lower face of the optical path converting type optical coupling element 1, it is necessary to arrange the micro lens 3 on the front face of the optical path converting type optical coupling element 1 as shown in FIG. 1. Further, when the optical fiber is opposed to the front face of the optical path converting type optical coupling element 1 and the light emitting element is arranged on the lower face of the optical path converting type optical coupling element 1, it is necessary to arrange the micro lens on the lower face of the optical path converting type optical coupling element 1.

Accordingly, it is conventionally necessary to manufacture the optical path converting type optical coupling elements 1 of different structures when the optical path converting type optical coupling element 1 is used between the optical fiber and the light receiving element, and when the optical path converting type optical coupling element 1 is used between the optical fiber and the light emitting element. Further, no optical path converting type optical coupling element 1 can be used when the bidirectional coupling is performed between the optical fibers.

The inventors of the present invention have tried a method in which the position of an end face of the optical fiber is shifted until a focal position of the micro lens 3 and a lens substrate arranging plural micro lenses (micro lens array) therein is attached onto the lower face 5 of the optical path converting type optical coupling element 1 so as to bidirectionally use the optical path converting type optical coupling element 1 as shown in FIG. 1.

However, if the lens substrate having the plural micro lenses is intended to be attached onto the lower face 5 of the optical path converting type optical coupling element 1, it is necessary to make an optical axis adjustment (core adjusting work) of the micro lens 3 of the front face of the glass substrate 2 and the micro lens arranged in the micro lens substrate. Therefore, it becomes difficult to assembly the optical path converting type optical coupling element 1. Further, since the optical fiber must be arranged in a position far from an original set position, it also becomes difficult to make the optical axis adjustment of the optical fibers. Further, since the number of parts is increased, it takes time and labor to assemble the optical path converting type optical coupling element, and its cost is raised.

Patent literature 1: JP-A-9-281302

DISCLOSURE OF THE INVENTION

An object of the present invention is to provide an optical path converting type optical coupling element able to be bidirectionally used and restrain the number of parts at its minimum.

An optical path converting type optical coupling element in the present invention is characterized in that two faces approximately perpendicular to a resin molding body and a total reflecting face approximately having an angle of 45° with respect to the two faces are formed, and plural lenses are respectively integrally arranged on the two faces.

In accordance with the optical path converting type optical coupling element of the present invention, after light incident by passing through a lens formed on one face is reflected on the total reflecting face, this light can be emitted from a lens formed on the other face to the exterior. It is possible to optically couple an optical fiber, a light emitting element, a light receiving element, etc. arranged so as to be opposed to the two faces of the resin molding body. Further, in this optical path converting type optical coupling element, the respective lenses are integrally arranged on the two faces of the resin molding body. Accordingly, no assembly of the resin molding body and the lenses is required, and the optical axis adjustment of the lenses, etc. are not required so that the optical path converting type optical coupling element can be simply manufactured and its cost can be reduced. Further, since the lenses are respectively arranged on the two faces, there is an advantage able to bidirectionally couple the optical fiber, the light emitting element, the light receiving element, etc.

It is also characterized in that each of the lenses in an embodiment mode of the present invention is a lens for converting light incident so as to be approximately emitted from one point into parallel light.

In the embodiment mode of the present invention, the lens for converting light incident so as to be approximately emitted from one point into parallel light is used. Accordingly, the light emitted from the optical fiber, etc. becomes the parallel light and is guided into the resin molding body, and is incident to the total reflecting face. As this result, leakage of the light on the total reflecting face is reduced, and coupling efficiency of the light can be improved.

In another embodiment mode of the present invention, it is also characterized in that a spacer having a thickness approximately equal to the focal distance of the lens is integrally projected on each of the two faces.

In another embodiment mode of the present invention, the spacer having a thickness approximately equal to the focal distance of the lens is integrally projected on each of the two faces. Accordingly, an end face of the optical fiber, the light emitting element, the light receiving element, etc. can be arranged approximately in the focal position of the lens by making this spacer come in contact with an optical connector holding the optical fiber, a circuit substrate mounting the light emitting element and the light receiving element, etc.

In still another embodiment mode of the present invention, it is also characterized in that plural holes used for positioning at a connecting time are opened on each of the two faces.

In still another embodiment mode of the present invention, the plural holes used for positioning at the connecting time are opened on each of the two faces. Accordingly, the positioning of the optical connector, etc. and the optical path converting type optical coupling element, and the optical axis adjustment can be simply made by inserting the guide pin inserted into the optical connector, etc. into this hole.

In still another embodiment mode of the present invention, it is also characterized in that a hollow is formed in a portion of the resin molding body on the side opposed to the total reflecting face. Further, the inner face of the hollow may be formed in parallel with the total reflecting face, and the distance from each lens to the total reflecting face along the optical axis of each lens formed on the two faces, and the distance from the inner face of the hollow to the total reflecting face may be approximately equal to each other.

In still another embodiment mode of the present invention, the hollow is formed in a portion of the resin molding body on the side opposed to the total reflecting face. Accordingly, a shrinkage cavity on the total reflecting face, a warp of the resin molding body, etc. at the molding time can be restrained at its minimum. In particular, if the inner face of the hollow is formed in parallel with the total reflecting face, and the distance from each lens to the total reflecting face along the optical axis of each lens formed on the two faces, and the distance from the inner face of the hollow to the total reflecting face are approximately equal to each other, it is also possible to reduce the shrinkage cavity of the lens together with the shrinkage cavity of the total reflecting face.

The constructional elements of this invention explained above can be arbitrarily combined as much as possible.

Figure 1:
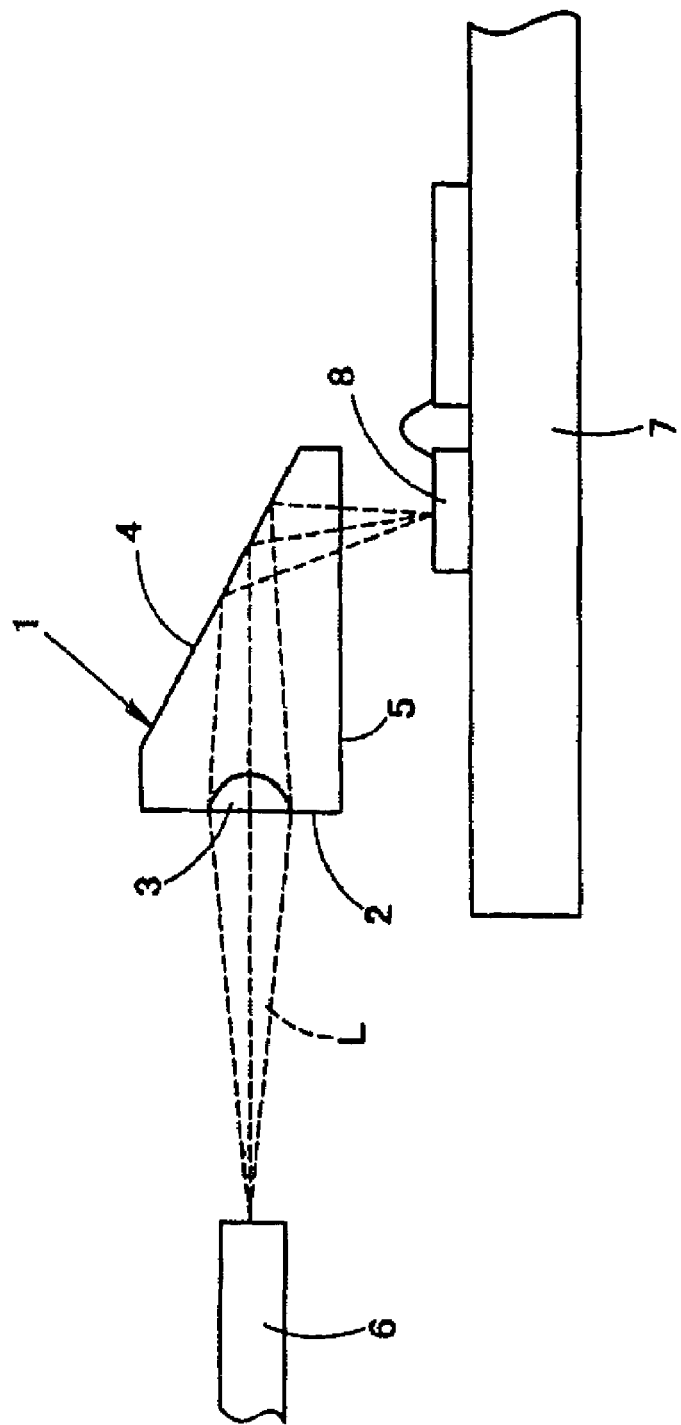
FIG. 1 is a view for explaining the structure of a conventional optical path converting type optical coupling element and its using state.

Main reference numerals used in the drawings are follows.

11 optical path converting type optical coupling element
15 front face
16 collimating lens
17 spacer
18 guide hole
19 lower face
20 collimating lens
21 spacer
22 guide hole
23 total reflecting face
26 wall taking-away portion
30A, 30B optical connector
31 optical fiber
33 guide pin

BEST MODE FOR CARRYING OUT THE INVENTION

The embodiments of the present invention will next be concretely explained. However, the present invention is not limited to the following embodiments, but can be naturally modified in the scope not departing from the technical idea of the present invention.

Figure 2:
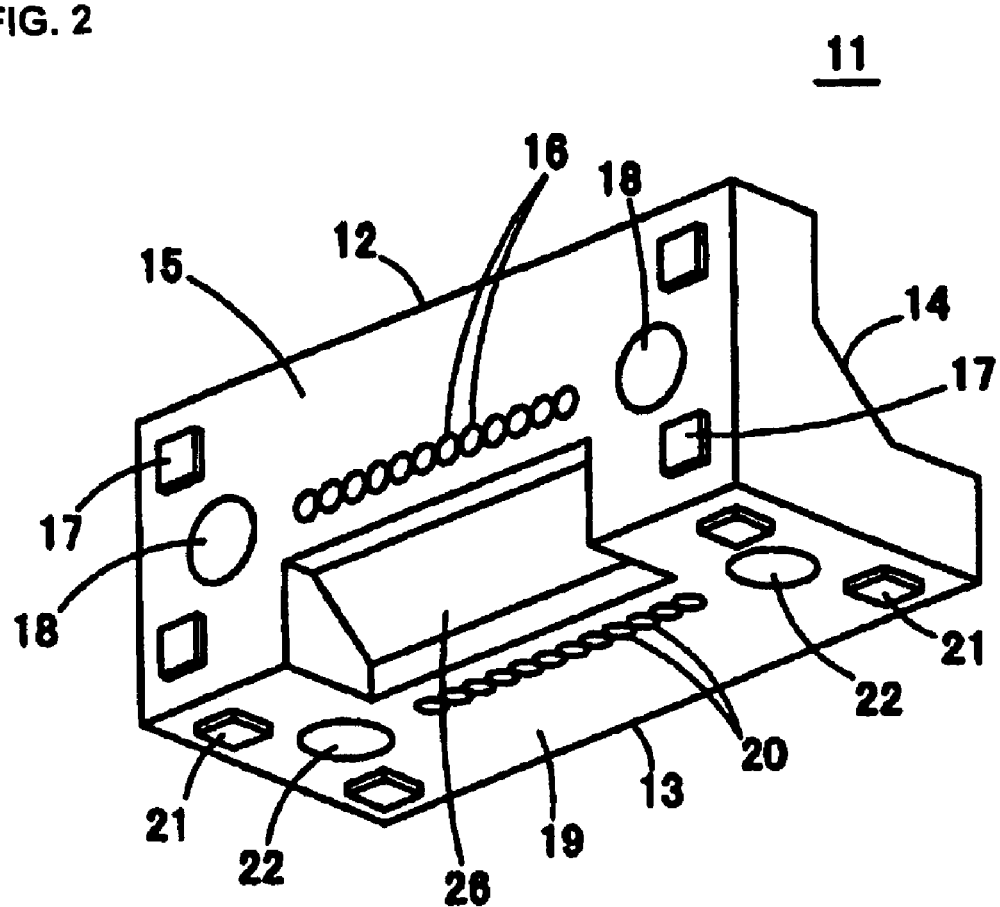
FIG. 2 is a perspective view showing an optical path converting type optical coupling element in the present invention and seen upward on the front face side.
Figure 3:
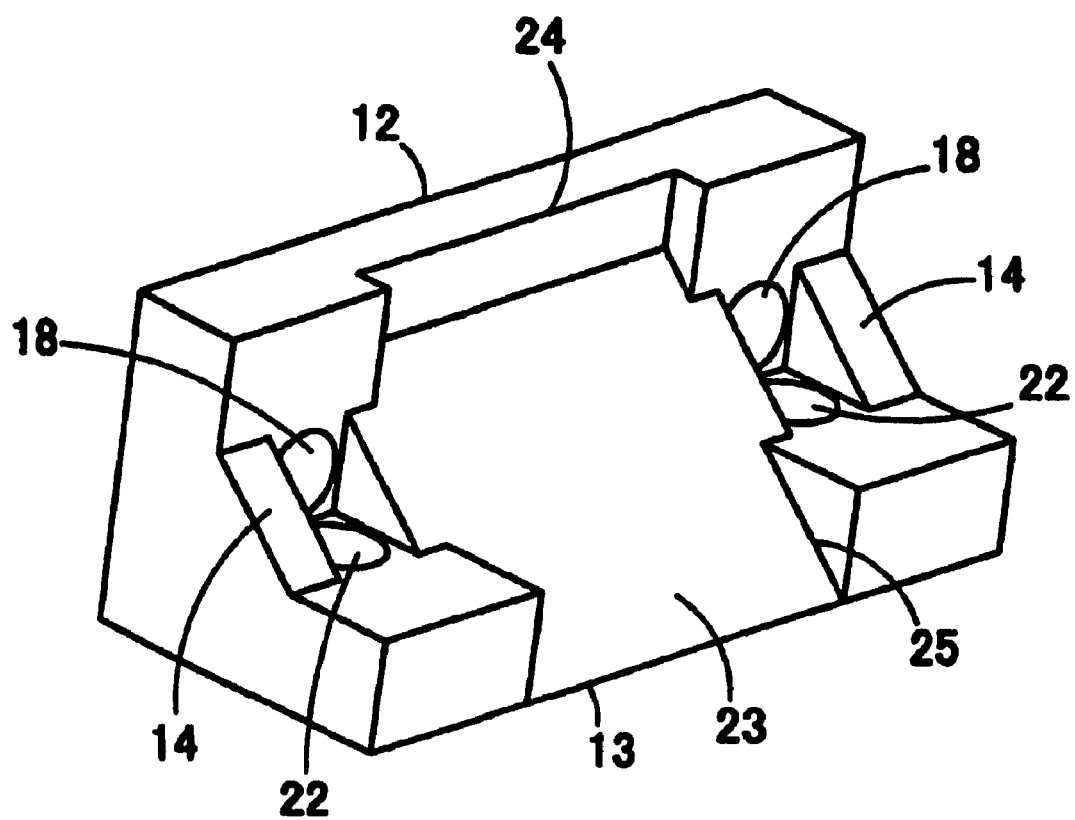
FIG. 3 is a perspective view seen downward on the rear face side of this optical path converting type optical coupling element.
Figure 4:
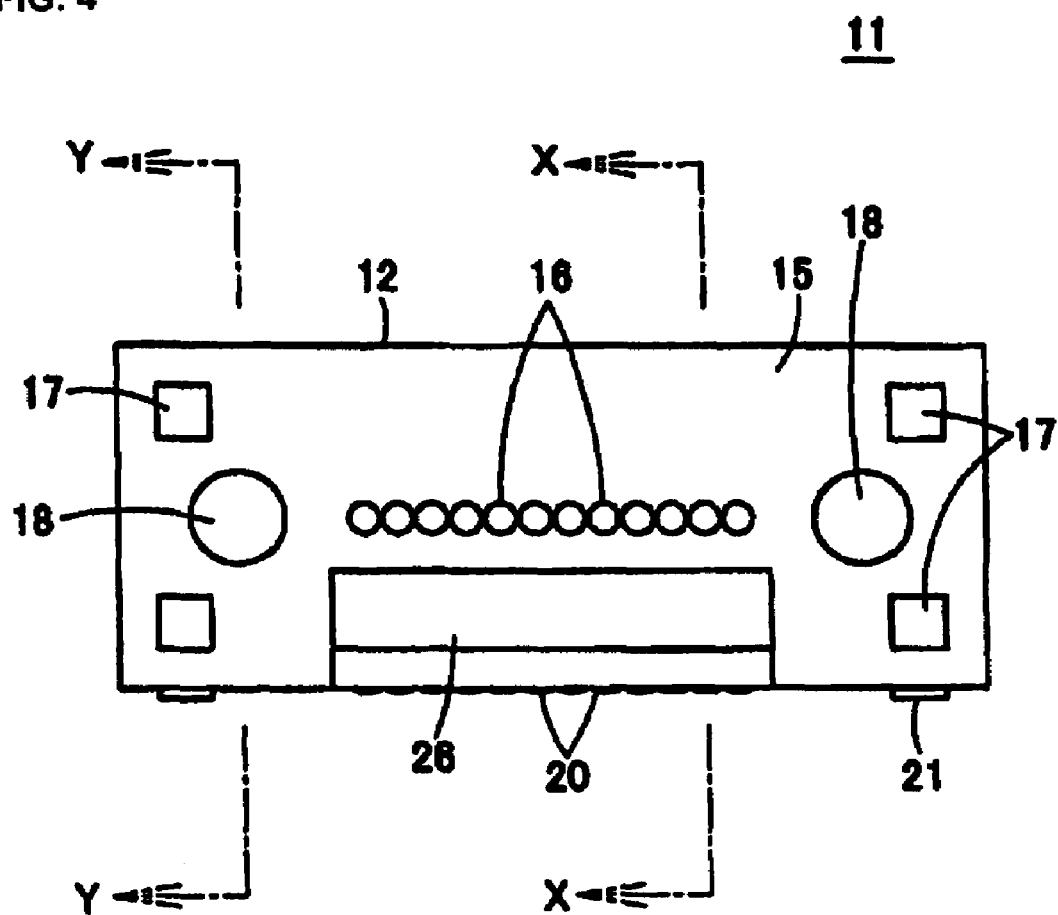
FIG. 4 is a front view of this optical path converting type optical coupling element.
Figure 5:
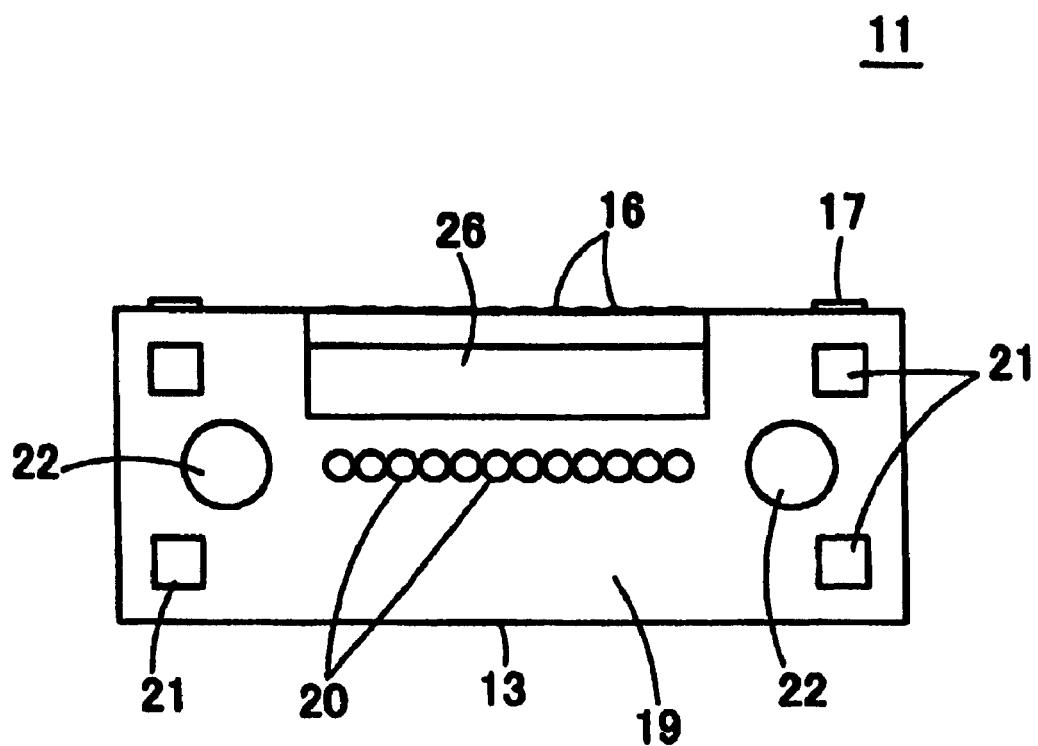
FIG. 5 is a bottom view of this optical path converting type optical coupling element.
Figure 6:
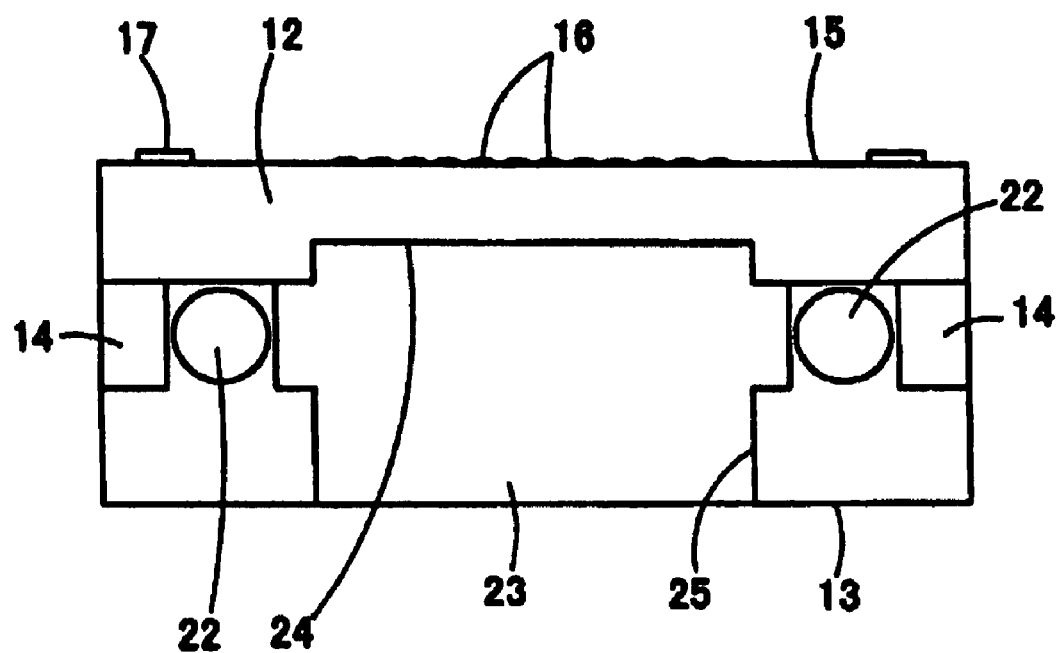
FIG. 6 is a plan view of this optical path converting type optical coupling element.
Figure 7:
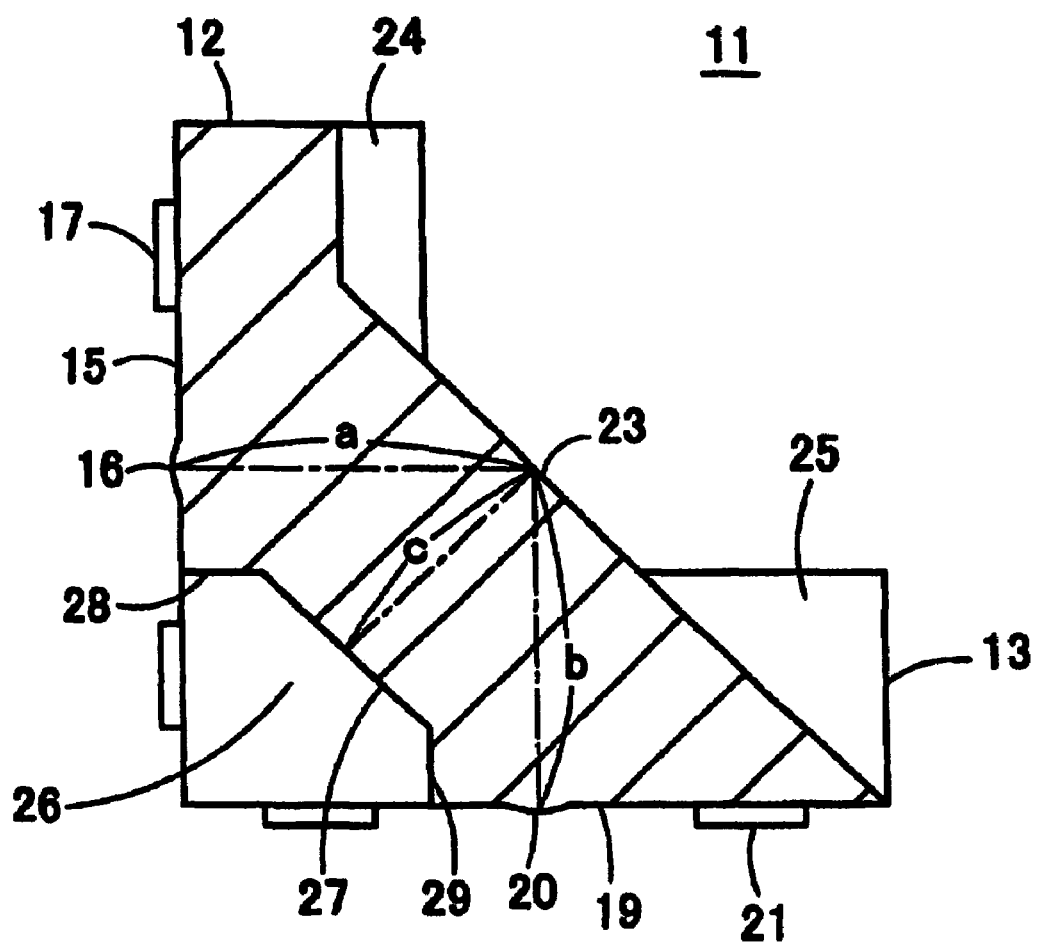
FIG. 7 is an X-X line sectional view of FIG. 4.
Figure 8:
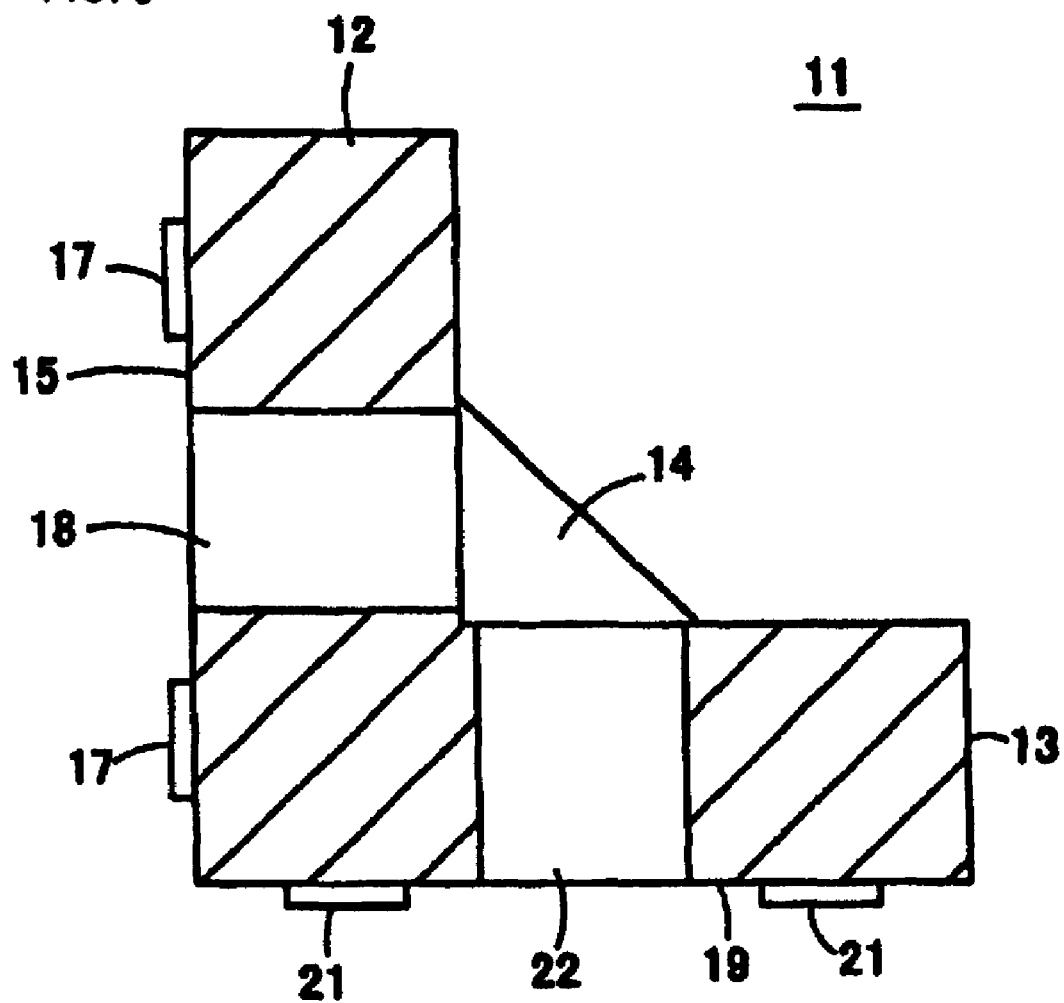
FIG. 8 is a Y-Y line sectional view of FIG. 4.

FIG. 2 is a perspective view showing an optical path converting type optical coupling element 11 in accordance with one embodiment of the present invention and seen upward on the front face side. FIG. 3 is a perspective view seen downward on the rear face side of the optical path converting type optical coupling element 11. FIGS. 4, 5 and 6 are respectively a front view, a bottom view and a plan view of the optical path converting type optical coupling element 11. FIG. 7 is an X-X line sectional view of FIG. 4. FIG. 8 is a Y-Y line sectional view of FIG. 4. This optical path converting type optical coupling element 11 is entirely integrally molded by transparent resin. For example, the optical path converting type optical coupling element 11 is integrally molded by injection molding by thermoplastic transparent resin of 1.5 in refractive index.

The optical path converting type optical coupling element 11 has a first connecting portion 12 located on the front face side, and a second connecting portion 13 located on the lower face side. A lower end portion of the first connecting portion 12 and a front end portion of the second connecting portion 13 are integrally connected so that the optical path converting type optical coupling element 11 is formed approximately in an L-shape. Further, as shown in FIG. 3, the strength between the first connecting portion 12 and the second connecting portion 13 is raised by integrally arranging a triangular rib 14 between each of the left and right end portions of the first connecting portion 12 and each of the left and right end portions of the second connecting portion 13.

The front face 15 of the first connecting portion 12 is set to a face perpendicular to a horizontal face. As shown in FIG. 4, plural (e.g., 12) collimating lenses 16 (lens array) constructed by spherical lenses or aspherical lenses are transversally arranged in a line in the central portion of this front face 15. At least three spacers 17 are projected on the front face 15 of the first connecting portion 12. The height of this spacer 17 is set to be approximately equal to the focal distance of the collimating lens 16. Further, as shown in FIG. 8, a guide hole 18 formed in a columnar shape extends through each of both the left and right side portions of the first connecting portion 12 in the forward and backward directions. The collimating lens 16 is arranged in a predetermined position with the center of the guide hole 18 as a reference. Further, the collimating lens 16 is arranged at a constant pitch.

The lower face 19 of the second connecting portion 13 is set to a horizontal face. As shown in FIG. 5, plural (e.g., 12) collimating lenses 20 (lens array) constructed by spherical lenses or aspherical lenses are transversally arranged in a line in the central portion of the lower face 19. At least three spacers 21 are projected on the lower face 19 of the second connecting portion 13. The height of this spacer 21 is set to be approximately equal to the focal distance of the collimating lens 20. Further, as shown in FIG. 8, a guide hole 22 formed in a columnar shape extends through each of both the left and right side portions of the second connecting portion 13 in the vertical direction. The collimating lens 20 is arranged in a predetermined position with the center of the guide hole 22 as a reference. Further, the collimating lens 20 is arranged at a constant pitch.

As shown in FIGS. 3 and 7, a total reflecting face 23 inclined so as to have an angle of 45° with respect to the front face 15 of the first connecting portion 12 and the lower face 19 of the second connecting portion 13 is arranged from the rear face side of the first connecting portion 12 to the upper face side of the second connecting portion 13. As shown in FIGS. 3 and 6, the total reflecting face 23 is not arranged in a position corresponding to the guide holes 18, 22, but is arranged in a position opposed to the collimating lenses 16, 20. Further, a concave portion 24 is arranged on the rear face of the first connecting portion 12. A concave portion 25 is also arranged on the upper face of the second connecting portion 13. The length along an inclining direction of the total reflecting face 23 is secured by forming the total reflecting face 23 between both the concave portions 24 and 25.

As shown in FIG. 7, the distance a from the front face 15 of the first connecting portion 12 to the total reflecting face 23 measured along the optical axis of the collimating lens 16 arranged in the first connecting portion 12, and the distance b from the lower face 19 of the second connecting portion 13 to the total reflecting face 23 measured along the optical axis of the collimating lens 20 arranged in the second connecting portion 13 are set to be equal to each other.

As shown in FIGS. 2 and 7, a wall taking-away portion (concave place) 26 is arranged in an outer corner portion between the first connecting portion 12 and the second connecting portion 13 so as to be opposed to the total reflecting face 23. This wall taking-away portion 26 is constructed by an inclining face 27 parallel to the total reflecting face 23, a horizontal face 28 located at the upper end of the inclining face 27 and parallel to the lower face 19 of the second connecting portion 13, and a vertical face 29 located at the lower end of the inclining face 27 and parallel to the front face 15 of the first connecting portion 12. The wall thickness of portion at which the total reflecting face 23 is arranged can be thinly set by arranging such a wall taking-away portion 26. Accordingly, a shrinkage cavity of the total reflecting face 23 at a molding time can be minimized so that the diffusion of light due to the shrinkage cavity of the total reflecting face 23 can be prevented. Further, shrinkage cavities on the front face 15 and the lower face 19 can be also prevented by arranging such a wall taking-away portion 26. Thus, it is possible to prevent that a warp is caused in the optical path converting type optical coupling element 11.

Further, the distance c between the inclining face 27 and the total reflecting face 23 is equal to the distance a along the optical axis of the collimating lens 16 (or the distance b along the optical axis of the collimating lens 20). When the distance c between the inclining face 27 and the total reflecting face 23 is excessively small, the shrinkage cavity is caused in the positions of the collimating lens 16 and the collimating lens 20. Accordingly, it is desirable to set this distance c to be approximately equal to the distance a along the optical axis of the collimating lens 16 (or the distance b along the optical axis of the collimating lens 20).

The optical path converting type optical coupling element 11 of the present invention is entirely integrally molded by resin as mentioned above. Accordingly, the number of parts can be reduced and the cost of parts can be cheaply manufactured. Further, since the optical path converting type optical coupling element 11 is integrally molded as a resin molding body, time and labor for assembling the optical path converting type optical coupling element 11 and the core adjusting work of the collimating lenses 16, 20 are not required. Accordingly, the optical path converting type optical coupling element 11 is easily manufactured and its cost is easily reduced. Further, return light, scattering, etc. can be reduced at the interface of a different material, etc. by integrally molding the optical path converting type optical coupling element 11.

Figure 9:
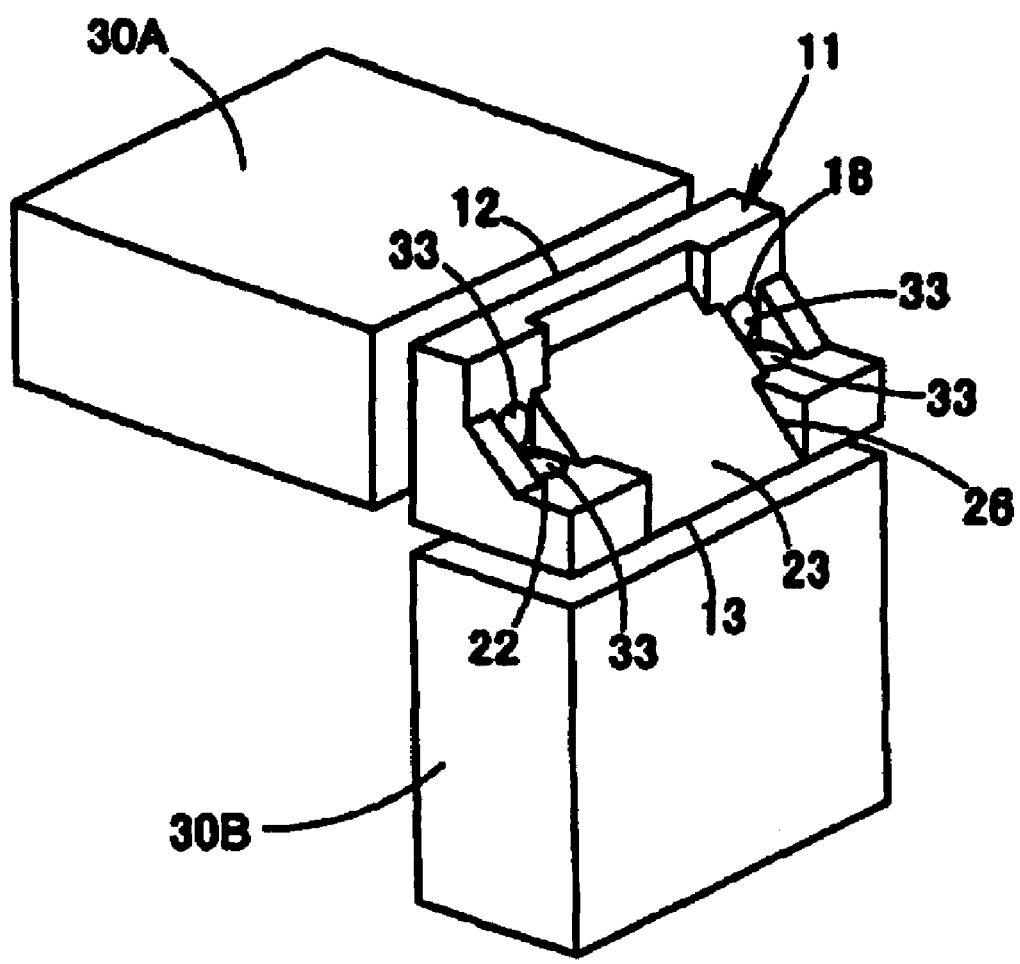
FIG. 9 is a perspective view showing a state in which two optical connectors are connected by using the optical path converting type optical coupling element of the present invention.
Figure 10:
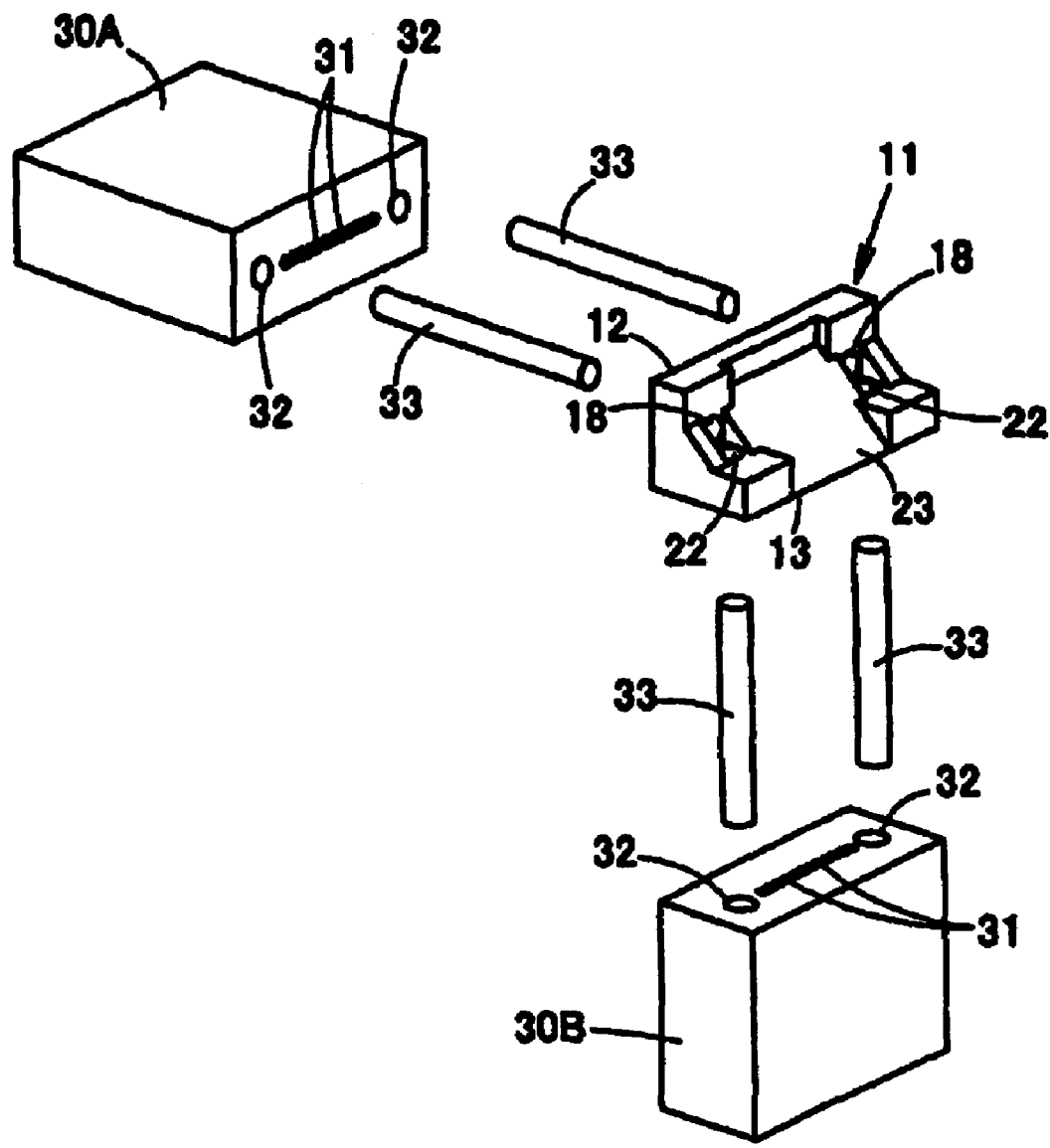
FIG. 10 is an exploded perspective view of FIG. 9.

FIG. 9 is a perspective view showing a state in which two optical connectors 30A, 30B are connected by using the optical path converting type optical coupling element 11 of the present invention. FIG. 10 is its exploded perspective view. The illustrated optical connectors 30A, 30B are multi-core optical connectors such as MT connectors, MPO connectors available in the market. As shown in FIG. 10, plural (e.g., 12) optical fibers 31 are held, and end races of the respective optical fibers 31 are arranged and held in a line on the tip faces of the optical connectors 30A, 30B. A pair of guide holes 32 extend through both the left and right sides of the optical fiber 31.

Each of the diameter of the guide hole 18 bored in the first connecting portion 12 of the optical path converting type optical coupling element 11, and the diameter of the guide hole 22 bored in the second connecting portion 13 is equal to the diameters of the guide holes 32 of the optical connectors 30A, 30B. A guide pin 33 having a diameter equal to that of each of the guide holes 18, 22, 32 can be inserted into each of the guide holes 18, 22, 32 without backlash.

The arranging pitch of the collimating lens 16 on the front face 15 of the first connecting portion 12 of the optical path converting type optical coupling element 11, and the arranging pitch of the collimating lens 20 on the lower face 19 of the second connecting portion 13 are equal to the arranging pitch of the optical fiber 31 held in the optical connectors 30A, 30B. Further, each collimating lens 16 of the optical path converting type optical coupling element 11 is arranged in a predetermined position with the center of the guide hole 18 as a reference. Each collimating lens 20 is arranged in a predetermined position with the center of the guide hole 22 as a reference. Further, the end face of the optical fiber 31 of each of the optical connectors 30A, 30B is also arranged in a predetermined position with the center of the guide hole 32 as a reference. Furthermore, the respective collimating lenses 16, 20 and the end face of each optical fiber 31 are arranged so as to form the same position relation with the center of each of the guide holes 18, 22, 32 as a reference.

Accordingly, when a guide pin 33 inserted into the guide hole 32 of the optical connector 30A is inserted into the guide hole 18 of the first connecting portion 12 of the optical path converting type optical coupling element 11, the optical connector 30A and the optical path converting type optical coupling element 11 are connected, and the end face of each optical fiber 31 and each collimating lens 16 are opposed to each other. Namely, the optical axis of each optical fiber 31 of the optical connector 30A and the optical axis of the collimating lens 16 of the first connecting portion 12 are conformed by the guide pin 33. Similarly, when the guide pin 33 inserted into the guide hole 32 of the optical connector 30B is inserted into the guide hole 22 of the second connecting portion 13 of the optical path converting type optical coupling element 11, the optical connector 30B and the optical path converting type optical coupling element 11 are connected, and the end face of each optical fiber 31 and each collimating lens 20 are opposed to each other. The optical axis of each optical fiber 31 of the optical connector 30B and the optical axis of the collimating lens 20 of the second connecting portion 13 are conformed by the guide pin 33. Accordingly, it is possible to simply make the core adjustment (optical axis alignment) of the optical fibers 31 of the optical connectors 30A, 30B and the collimating lenses 16, 20 of the optical path converting type optical coupling element 11.

In a connecting state of the optical connector 30A and the optical path converting type optical coupling element 11, the spacer 17 of the first connecting portion 12 comes in contact with the end face of the optical connector 30A. Similarly, in a connecting state of the optical connector 30B and the optical path converting type optical coupling element 11, the spacer 21 of the second connecting portion 13 comes in contact with the end face of the optical connector 30B. The spacers 17, 21 may be respectively adhered to the end faces of the optical connectors 30A, 30B to hold these states. Otherwise, in a state in which the spacers 17, 21 respectively come in contact with the end faces of the optical connectors 30A, 30B, the optical connectors 30A, 30B and the optical path converting type optical coupling element 11 may come in press contact with each other and may be also held by using a fitting of a clip shape, etc.

Figure 11:
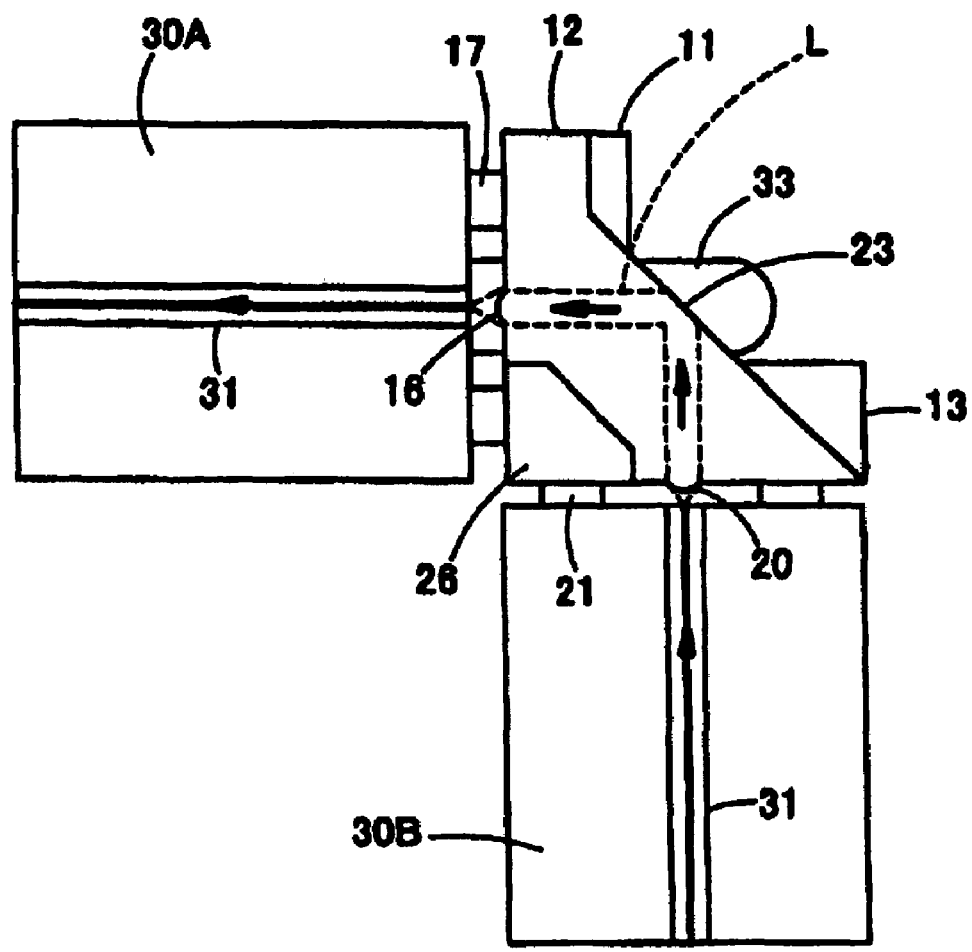
FIG. 11 is an operating explanatory view of FIG. 9.

FIG. 11 is an operating explanatory view of the optical connector 30A and the optical connector 30B perpendicularly connected through the optical path converting type optical coupling element 11. In this optical path converting type optical coupling element 11, the thickness of the spacer 21 is set to be approximately equal to the focal distance of the collimating lens 20. The core end face of the optical fiber 31 is approximately located at the focal point of the collimating lens 20. Accordingly, when light (optical signal) L is emitted from the core end face of the optical fiber 31 held by the optical connector 30B, this light L passes through the collimating lens 20 so that this light L is converted into parallel light. This light L is then advanced in the vertical direction, and is incident to the total reflecting face 23 at an angle of 45° while this light L is the parallel light. The parallel light incident to the total reflecting face 23 is totally reflected on the total reflecting face 23 in the horizontal direction, and is incident to the collimating lens 16. Since the thickness of the spacer 17 is approximately equal to the focal distance of the collimating lens 16 and the core end face of the optical fiber 31 is approximately located at the focal point of the collimating lens 16, the parallel light incident to the collimating lens 16 is converged by the collimating lens 16 and the converged light L is coupled to the core end face of the optical fiber 31 held by the optical connector 30A.

Similarly, the optical signal emitted from the optical fiber 31 of the optical connector 30A on the front face side can be also incident to the optical fiber 31 of the optical connector 30B of the lower face side through the optical path converting type optical coupling element 11 although this construction is not illustrated in the drawings. Namely, in this optical path converting type optical coupling element 11, it is possible to bidirectionally couple the optical fiber 31 of the optical connector 30A and the optical fiber 31 of the optical connector 30B.

Further, the sensitivity of an axis shift of the optical fiber 31 is reduced by respectively arranging the collimating lenses 16, 20 on the front face 15 and the lower face 19 of the optical path converting type optical coupling element 11 so that the core aligning work is simplified.

Accordingly, for example, light emitted from the optical fiber 31 of the optical connector 30A is converted into parallel light by the collimating lens 16, and is then totally reflected on the total reflecting face 23, and is guided to the collimating lens 20. This light is then converged by the collimating lens 20, and is coupled to the optical fiber 31 of the optical connector 30B. Accordingly, scattering of the light can be reduced, and coupling efficiency of the light between the respective optical fibers 31 of the optical connector 30A and the optical connector 30B is raised. Further, since the light is incident to the total reflecting face 23 as the parallel light, this light is incident to the total reflecting face 23 at a constant incident angle. As its result, leakage of the light on the total reflecting face 23 can be restrained, and the light can be coupled with higher efficiency. Further, since the light is reflected by the total reflection in this optical path converting type optical coupling element 11, reflection efficiency is high and it is not necessary to perform mirror face processing by metallic evaporation, etc.

Figure 12:
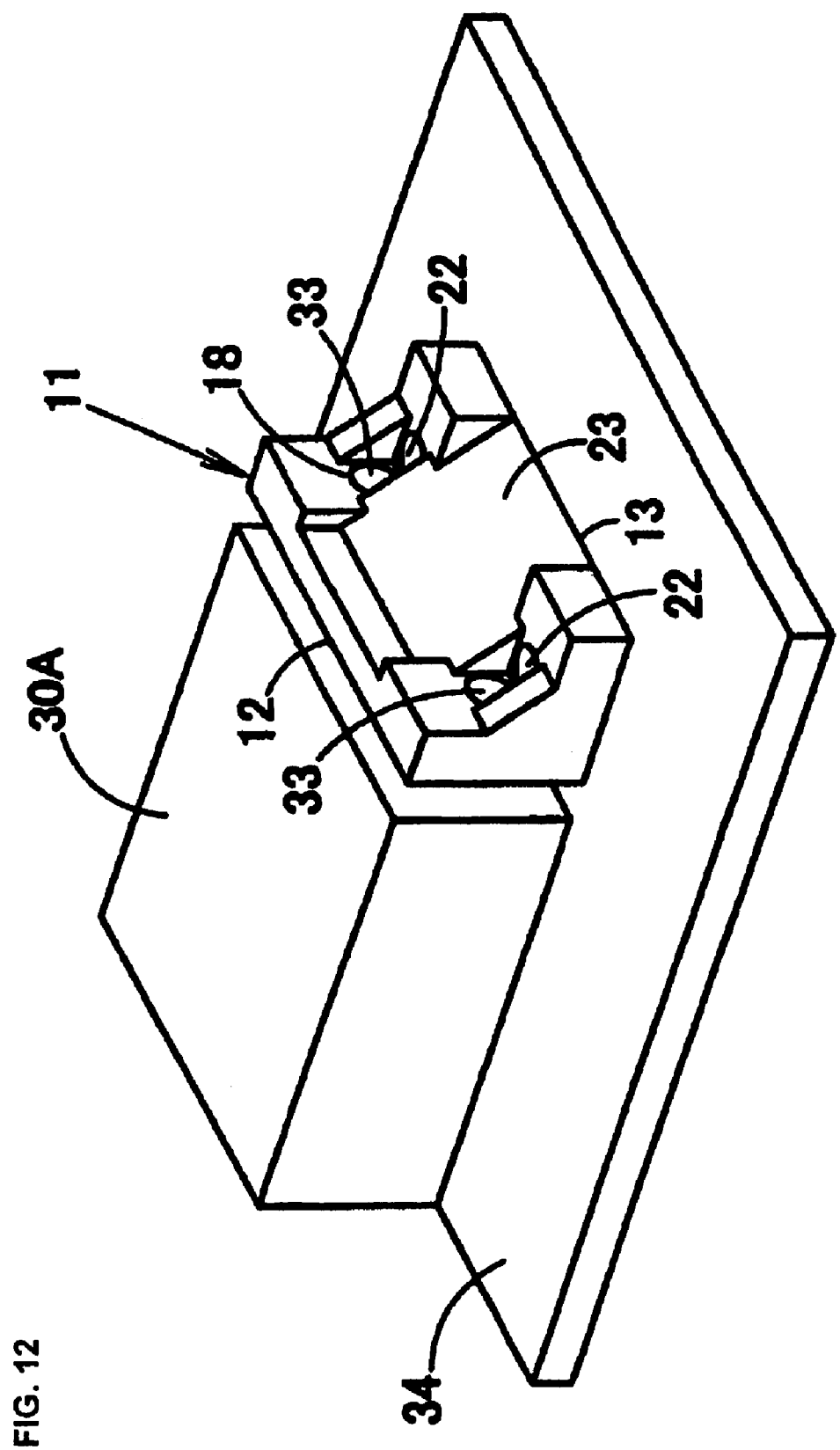
FIG. 12 is a perspective view showing a state in which an optical connector and an element on a circuit substrate are connected by using the optical path converting type optical coupling element of the present invention.
Figure 13:
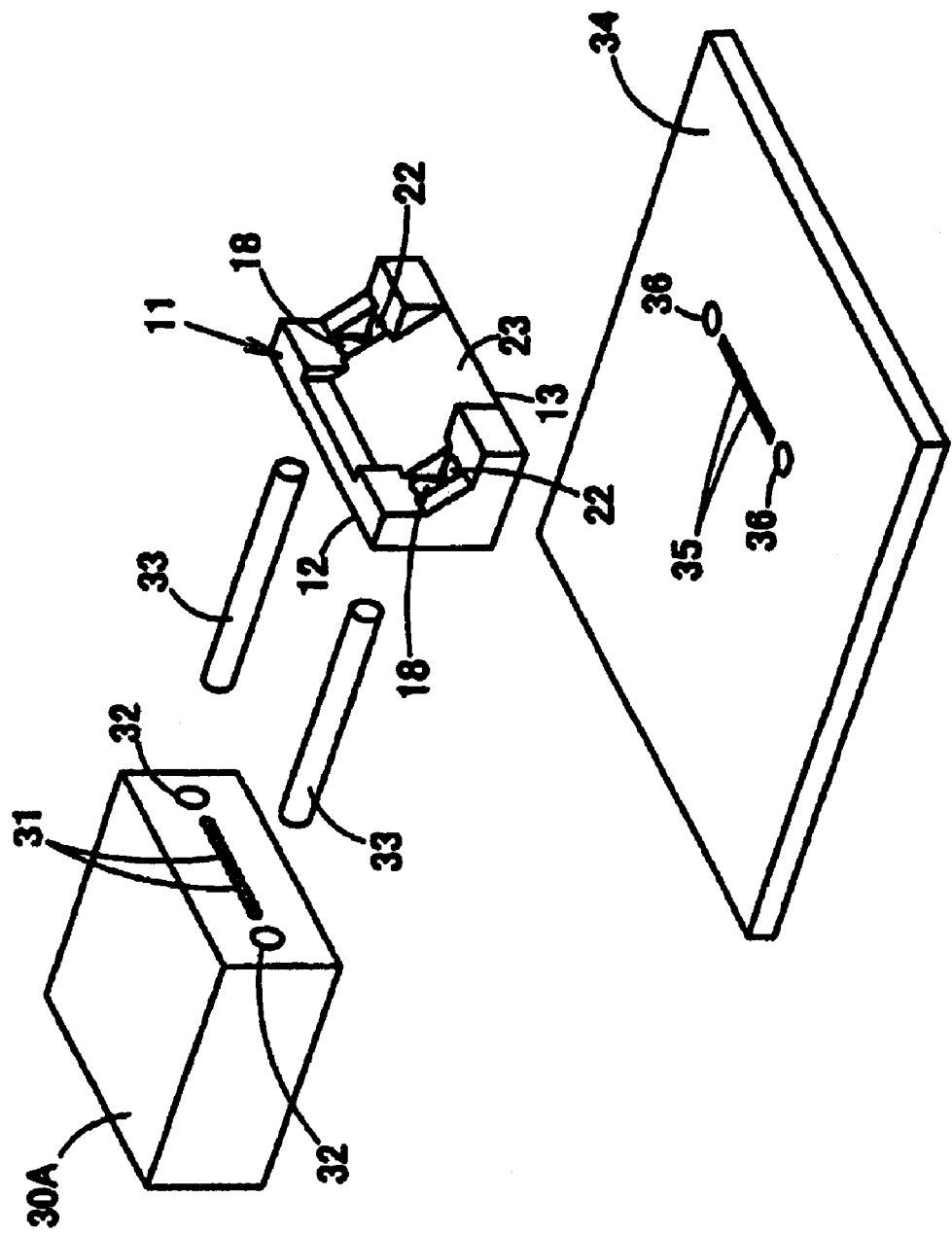
FIG. 13 is an exploded perspective view of FIG. 12.

FIG. 12 is a perspective view showing a connecting state of the optical connector 30A and a light receiving element 35 on a circuit substrate 34 by using the optical path converting type optical coupling element 11 of the present invention. FIG. 13 is its exploded perspective view. The optical connector 30A is connected to the optical path converting type optical coupling element 11 by inserting the guide pin 33 inserted into the guide hole 32 into the guide hole 18 of the first connecting portion 12 of the optical path converting type optical coupling element 11. The optical axis of each optical fiber 31 of the optical connector 30A and the optical axis of the collimating lens 16 of the first connecting portion 12 are conformed by the guide pin 33. Accordingly, it is possible to simply make the core adjustment of the optical fiber 31 of the optical connector 30A and the collimating lens 16 of the optical path converting type optical coupling element 11. Further, in a connecting state of the optical connector 30A and the optical path converting type optical coupling element 11, the end face of the optical fiber 31 is located in the focal position of the collimating lens 16 by making the spacer 17 of the first connecting portion 12 come in contact with the end face of the optical connector 30A.

As shown in FIG. 13, the light receiving element 35 of a photodiode, etc. is arranged on the upper face of the circuit substrate 34 at the same pitch as the collimating lens 20. Further, in the circuit substrate 34, a positioning hole 36 is opened to the light receiving element 35 so as to form the same position relation as the position relation of the guide hole 22 with respect to the collimating lens 20 on the lower face of the optical path converting type optical coupling element 11. Accordingly, in the optical path converting type optical coupling element 11, the spacer 21 comes in contact with the surface of the circuit substrate 34 on the circuit substrate 34, and the guide pin 33 inserted into the guide hole 22 of the second connecting portion 13 is fitted to the positioning hole 36 of the circuit substrate 34. Thus, it is possible to simply position the collimating lens 20 of the optical path converting type optical coupling element 11 and the light receiving element 35 on the circuit substrate 34. Further, the light receiving element 35 is located approximately in the focal position of the collimating lens 20 by the spacer 21.

A projection fitted to the guide hole 22 of the optical path converting type optical coupling element 11 may be also arranged in the circuit substrate 34 instead of the boring of the positioning hole 36 in the circuit substrate 34.

Figure 14:
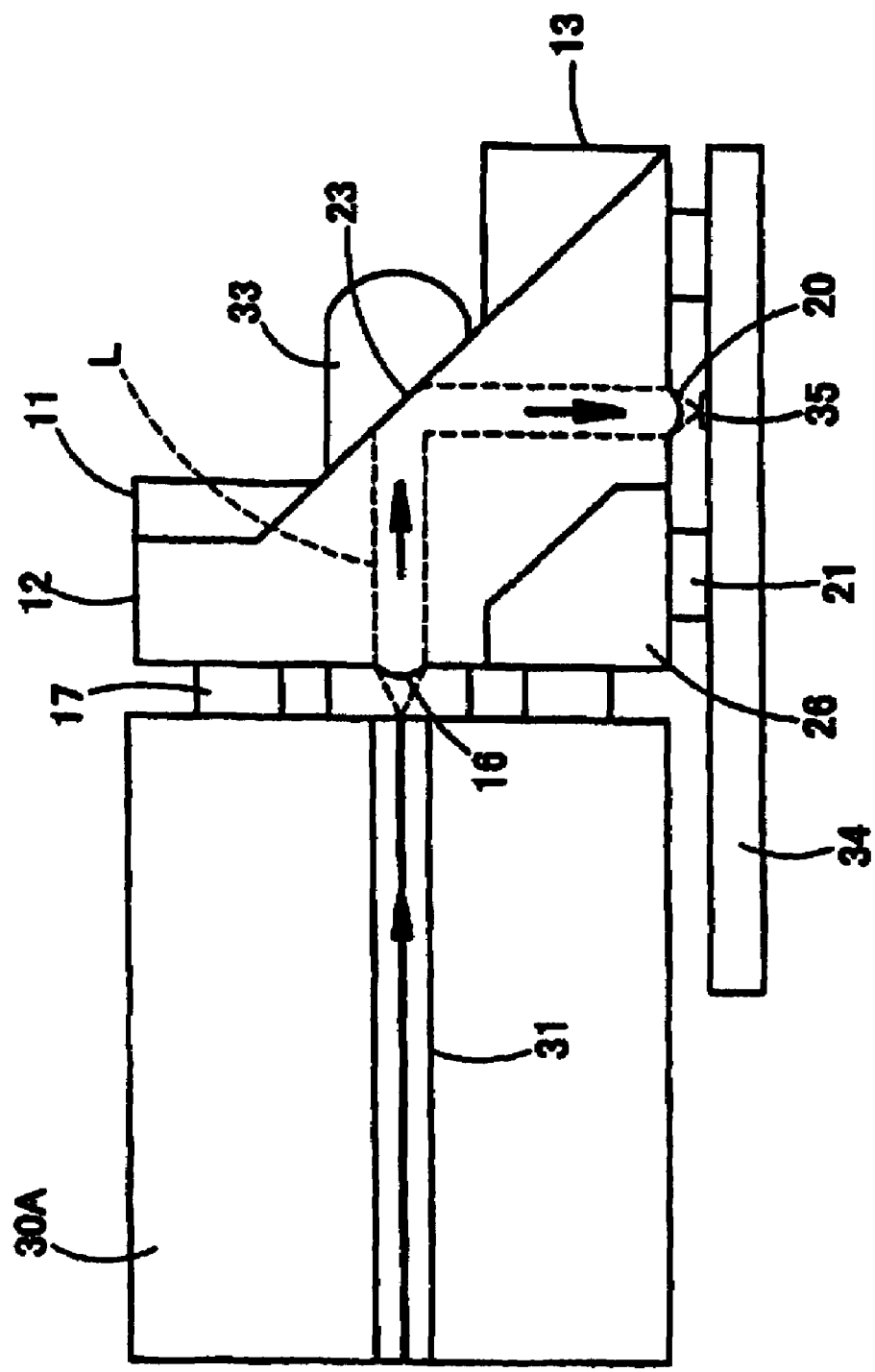
FIG. 14 is an operating explanatory view of FIG. 12.

FIG. 14 is an operating explanatory view of the optical connector 30A and the light receiving element 35 perpendicularly connected through the optical path converting type optical coupling element 11. In this optical path converting type optical coupling element 11, the thickness of the spacer 17 is approximately equal to the focal distance of the collimating lens 16, and the core end face of the optical fiber 31 is approximately located at the focal point of the collimating lens 16. Accordingly, when light (optical signal) L is emitted from the core end face of the optical fiber 31 held by the optical connector 30A, this light L is converted into parallel light by passing through the collimating lens 16. This light L is then advanced in the horizontal direction, and is incident to the total reflecting face 23 at an angle of 45° while this light L is the parallel light. The parallel light incident to the total reflecting face 23 is totally reflected downward on the total reflecting face 23, and is incident to the collimating lens 20. The thickness of the spacer 21 is approximately equal to the focal distance of the collimating lens 20, and the light receiving element 35 is approximately located at the focal point of the collimating lens 16. Accordingly, the parallel light incident to the collimating lens 20 is converged by the collimating lens 20, and the converged light L is received by the light receiving element 35.

Similarly, the optical signal emitted from the light emitting element mounted onto the circuit substrate 34 can be also incident to the optical fiber 31 of the optical connector 30A of the front face side through the optical path converting type optical coupling element 11 although this construction is not illustrated in the drawings. Namely, in this optical path converting type optical coupling element 11, it is possible to bidirectionally couple the optical fiber 31 of the optical connector 30A and the optical fiber 31 of the optical connector 30B. Further, the light emitting element and the light receiving element may be also simultaneously mounted to the circuit substrate 34.

In such a using mode, the axis shift sensitivity with respect to the optical fiber 31 is reduced by respectively arranging the collimating lenses 16, 20 on the front face 15 and the lower face 19 of the optical path converting type optical coupling element 11. Accordingly, the core adjusting work is simplified. Further, similar to the coupling case of the optical connectors 30A, 30B, the coupling efficiency of light can be raised. Further, if the optical path converting type optical coupling element 11 of the present invention is used, the optical connector 30A can be connected in a posture transversally fell to the circuit substrate 34. Accordingly, the height of a connecting portion can be reduced.

In the above embodiments, the collimating lenses 16, 20 are respectively arranged in a line in the first connecting portion 12 and the second connecting portion 13, but may be also arranged in two lines or more in each of the first connecting portion 12 and the second connecting portion 13. In accordance with such an optical path converting type optical coupling element 11, the present invention can be used when the optical path converting type optical coupling element is connected to an optical connector having optical fibers arranged in two lines or more, and when the optical path converting type optical coupling element is connected to a circuit substrate having elements such as the light emitting element, the light receiving element, etc. arranged in two lines.

INDUSTRIAL APPLICABILITY

The optical path converting type optical coupling element of the present invention is used when optical fibers are coupled, or the optical fiber and the light emitting element, the light receiving element, etc. are coupled in the field of optical communication.

The invention claimed is:

1. An optical path converting type optical coupling element, wherein two faces approximately perpendicular to one another and a total reflecting face approximately having an angle of 45° with respect to said two faces are formed, and plural lenses are respectively integrally arranged on said two faces, and
   wherein a spacer having a thickness approximately equal to the focal distance of said lens is integrally projected on each of said two faces.

2. An optical path converting type optical coupling element, wherein two faces approximately perpendicular to one another and a total reflecting face approximately having an angle of 45° with respect to said two faces are formed, and plural lenses are respectively integrally arranged on said two faces, and
   wherein plural holes used for positioning at a connecting time are opened on each of said two faces.

3. An optical path converting type optical coupling element, wherein two faces approximately perpendicular to one another and a total reflecting face approximately having an angle of 45° with respect to said two faces are formed, and plural lenses are respectively integrally arranged on said two faces,
   wherein a hollow is formed in a portion of said resin molding body on the side opposed to said total reflecting face, and
   wherein said hollow comprises an inclining face formed in parallel with said total reflecting face.

4. An optical path converting type optical coupling element, wherein two faces approximately perpendicular to one another and a total reflecting face approximately having an angle of 45° with respect to said two faces are formed, and plural lenses are respectively integrally arranged on said two faces,
   wherein a hollow is formed in a portion of said resin molding body on the side opposed to said total reflecting face, and
   wherein the inner face of said hollow is formed in parallel with said total reflecting face, and the distance from each lens to said total reflecting face along the optical axis of each lens formed on said two faces, and the distance from the inner face of said hollow to said total reflecting face are approximately equal to each other.

* * * * *